United States Patent [19]
Suarez

[11] Patent Number: 5,087,897
[45] Date of Patent: Feb. 11, 1992

[54] OSCILLATOR TUNABLE BY VARYING CURRENT IN SPIRAL INDUCTOR ON FERRITE SUBSTRATE

[75] Inventor: Jose I. Suarez, Coral Gables, Fla.

[73] Assignee: Motorola, Inc., Schaumburg, Ill.

[21] Appl. No.: 663,533

[22] Filed: Mar. 4, 1991

[51] Int. Cl.[5] .............................................. H03B 5/12
[52] U.S. Cl. .............................. 331/117 R; 331/181; 332/135; 336/200
[58] Field of Search ............ 331/181, 117 R, 117 FE, 331/117 D, 167; 332/129, 130, 13 J; 336/30, 155, 200; 334/71

[56] References Cited

U.S. PATENT DOCUMENTS

| | | | |
|---|---|---|---|
| 4,020,429 | 4/1977 | Bickley | 333/205 |
| 4,494,100 | 1/1985 | Stengel et al. | 336/200 |
| 4,527,130 | 7/1985 | Lütteke | 331/117 D X |

*Primary Examiner*—Siegfried H. Grimm
*Attorney, Agent, or Firm*—Robert S. Babayi

[57] ABSTRACT

An oscillator circuit is tunable by a tuning circuit which includes a spiral inductor disposed on a ferrite substrate. The oscillator circuit is tuned or modulated by varying a current through the spiral inductor.

12 Claims, 2 Drawing Sheets

OSCILLATOR TUNABLE BY VARYING CURRENT IN SPIRAL INDUCTOR ON FERRITE SUBSTRATE

TECHNICAL FIELD

This invention relates generally to the field of oscillator circuits and in particular to tuning and modulating the oscillator circuit.

BACKGROUND

Oscillators are used in a wide variety of electronic devices to generate a frequency output. In many applications, the frequency is utilized to derive other reference and clock signals for essential electronic circuitry. Therefore, the output of the oscillator needs to be accurately set to a desired frequency. However, most of the time, the generated frequency output comprise a nominal frequency output which requires to be adjusted. For example, in a radio receiver the local oscillator(s) may require tuning to receive at a specified receiver frequency. Therefore, nominal frequency output of the oscillator is adjusted via a tuning means to tune the radio receiver. Oscillator circuits which are tunable by mechanical means are known. Usually, these oscillators utilize a tunable inductor which includes a threaded slug. The inductance is varied by axially moving the slug through the inductor by for example a screw driver. However, mechanical tuning of the oscillators is a cumbersome process which requires human interaction. With the present trend toward automated manufacturing processes, human interaction is not desired and more and more processes require elimination of the human factor. Electronic tuning of the oscillator eliminates the human interaction therefore it is desired to electronically tune the oscillators.

Additionally, in some applications such as radio frequency synthesizers, the output of the oscillator is modulated before application to other synthesizer circuitry. Conventional, modulation circuitry utilizes a varactor which varies the reactance of the oscillating circuitry in accordance with a modulating signal. The varactor circuits, however, require complex biasing networks.

Accordingly, there is a desire to provide a circuit for generating a variable frequency output which overcomes the drawbacks of the conventional oscillator circuits.

SUMMARY OF THE INVENTION

Briefly, according to the invention, a circuit for generating a variable frequency output comprises an oscillator circuit having an output frequency and means for varying the output frequency. The means for varying the output frequency includes a conductive inductor pattern which is formed on a ferrite substrate. A variable current source responsive to a frequency variation signal provides current through the inductor pattern. The variations in the current through the inductor corresponds to variations in the output frequency.

DETAILED DESCRIPTION OF THE PREFERRED EMBODIMENT

Figure 1:
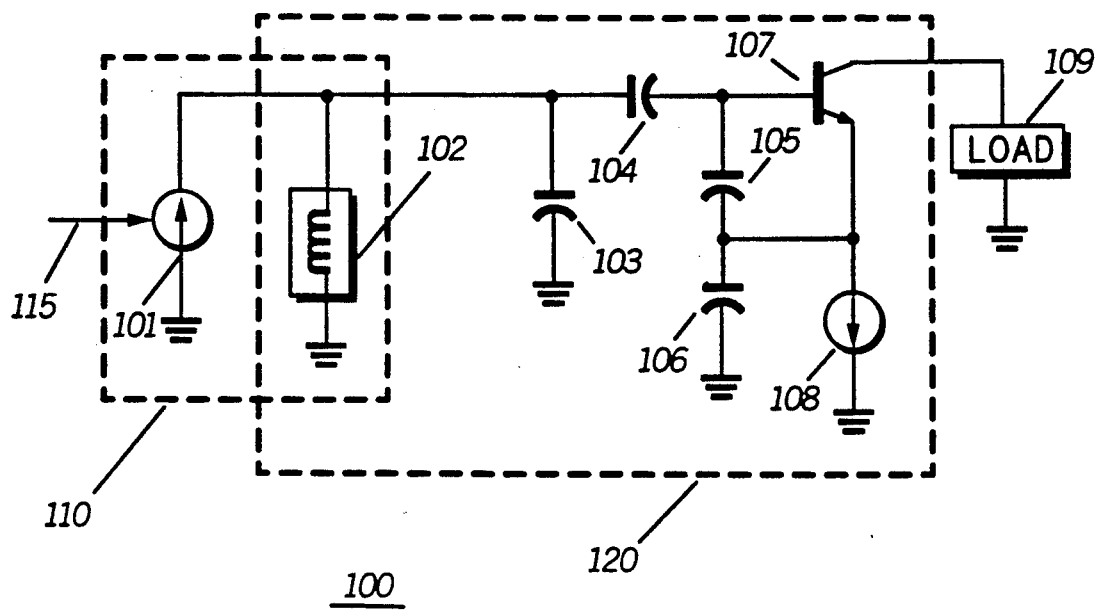
FIG. 1 is schematic diagram of a circuit for generating a variable frequency output according to the present invention.

Referring to FIG. 1, the schematic diagram of a circuit 100 for generating a variable frequency output according to the present invention includes a tunable oscillator circuit 120 the frequency output of which may be varied by a tuning circuit 110. As will be described later, in the preferred embodiment of the present invention, the circuit 100 is included in a frequency synthesizer circuit of a transceiver device. The transceiver device may comprise any radio device; such as a Saber two-way radio manufactured by Motorola Inc.

The oscillator circuit 120 may comprise any suitable oscillator circuit the output frequency of which is adjustable by varying a reactive element. One such oscillator circuit includes a transistor 107 which comprises an active element for providing the output frequency. The output frequency is applied to a load 109 coupled across the collector of the transistor 107. Emitter of the transistor 107 is connected to the ground via a constant current source 108 in a well known manner. The base of the transistor 107 is shunted by series coupled capacitors 105 and 106 which provide radio frequency coupling for the input of the transistor 107. A DC blocking capacitor 104 is coupled in series with the base of the transistor 107. A capacitor 103 and an inductor 102 are configured as a tank circuit which oscillates to provide the output frequency. As is well known the capacitance and inductance values of the capacitor 103 and the inductor 102 set the output frequency of the circuit 100. The tuning circuit 110 includes a variable current source 101 which is responsive to a frequency variation signal 115 and provides the current through the inductor 102. The change in the inductance of the inductor 102 which is the common element between the oscillator circuit 120 and the tuning circuit 110 corresponds to the variations of the frequency output. Accordingly, the tuning circuit 110 constitutes means for varying the output frequency of circuit 100.

According to the invention, the inductor 102 is formed on a ferrite substrate and current changes therethrough vary the permeability of the ferrite substrate. This will cause the inductance of the inductor 102 to vary accordingly. Therefore, the output frequency of the circuit may be varied in accordance with the current variations which are responsive to the frequency variation signal 115. It may be appreciated that in this arrangement, the frequency variation signal 115 may comprise either a modulating signal provided from, for example, a microphone or a frequency tuning signal for tuning the output frequency to a desired frequency.

Figure 2:
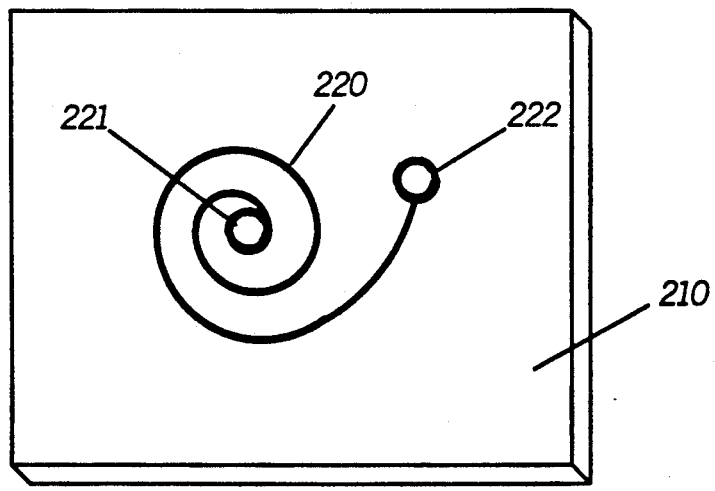
FIG. 2 illustrates an inductor being disposed on a ferrite substrate which is used on the circuit of FIG. 1.

Referring to FIG. 2, structure 200 of the inductor 102 of FIG. 1 according to the present invention is shown. The structure 200 includes a conductive inductor pattern 220 which is formed on a ferrite substrate 210 utilizing well known techniques. The inductor pattern 220 comprise a spiral pattern which is well known to provides the inductive characteristic of the structure 200. Although rounded spiral patterns are shown in FIG. 2, any suitable spiral pattern, such as square spiral patterns may be formed to achieve the purpose of the present invention. Preferably, the ferrite substrate is made of high Q ferrite material and is of sufficient area to accommodate the size of the inductor pattern 220. The inductor pattern 220 includes an inner end 221 and an outer end 222 which comprise the terminals of the inductor 102. In the preferred embodiment of the invention, the inner end 221 is grounded by means of a conductive feed through hole. The outer end is coupled to the variable current source 101. The current through the inductor pattern 220 generates a magnetic field which changes permeability factor ($\mu$) of the ferrite substrate 210. The change in the permeability factor therefore changes the inductance of the inductor 102. Accordingly, the inductance may be varied proportional to the current through the inductor 102. The amount of current and the permeability of the ferrite material may be selected to provide an optimum frequency variation factor (or modulation factor) for the desired application.

Figure 3:
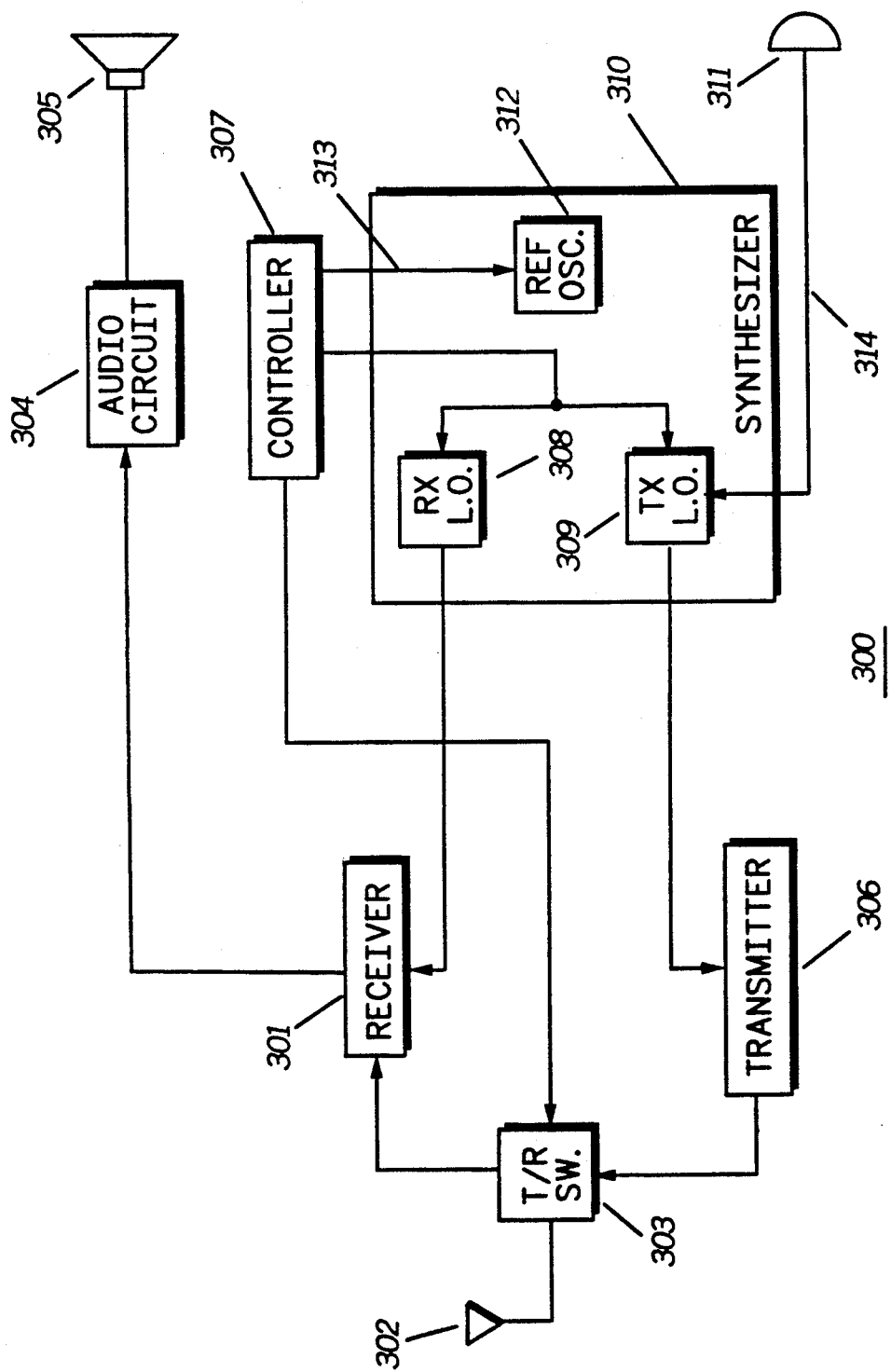
FIG. 3 is a block diagram of a radio which incorporates the circuit of the present invention.

Referring to FIG. 3, a radio 300 which utilizes the circuit 100 of the present invention is shown. The radio 300 includes a well known receiver circuit 301 which receives communication signals via an antenna 302 which is coupled to a receive and transmit switch 303. The receiver 301 provides recovered audio (voice) signals to audio circuitry 304 for delivery to a speaker 305. A transmitter 306 transmits communication signals via the antenna 302. Accordingly, the receiver circuit 301 and the transmitter 306 constitute a transceiver circuit for communicating communication signals in the radio 300. A controller 307 which comprise the heart of the radio 300 operates in a well known manner to control its operation. The controller 307 controls a receiver local oscillator circuit 308 and a transmitter local oscillator 309 to generate proper local oscillator frequencies. As is well known the receiver local oscillator circuit 308 and the transmitter local oscillator 309 may be a part of a frequency synthesizer 310 which is programmable by the controller 307 to set the receive and the transmit local oscillator frequencies for the radio 300.

In one application, the principles of the present invention are used to modulate the transmit local oscillator circuit 309. In this arrangement, the voice signal 314 from a microphone 311 is applied to the transmit local oscillator circuit 309 which operates according to the principles of the present invention to vary the transmit local oscillator frequency, thereby providing a modulated signal to be transmitted by the transmitter 306. In this manner the transmit signal is modulated simply by varying the current through the inductor 120 of FIG. 2, thereby eliminating the need for complex circuitry associated with varactor modulation techniques of conventional modulation circuits.

In another application, the principles of the present invention may be used to tune a reference oscillator 312 used in the synthesizer 310. The controller 307 may provide a tuning signal 313 for tuning the reference oscillator 312 to a reference frequency. Accordingly, the present invention provides a simple arrangement for electrical tuning of the reference oscillator without disadvantages associated with mechanical tuning.

What is claimed is:

1. A circuit for generating a variable frequency output comprising:

an oscillator circuit having a frequency output;
   a frequency variations means coupled to said oscillator circuit for varying said frequency output including:
   a conductive inductor pattern formed on a ferrite substrate; and
   a variable current source responsive to a frequency variation signal for providing current through said inductor.

2. The circuit of claim 1, wherein said inductor pattern comprises a spiral pattern.

3. The circuit of claim 1, wherein said frequency variation signal comprises a modulating signal.

4. The circuit of claim 1, wherein said frequency variation signal comprises a frequency tuning signal.

5. A circuit for generating a frequency output comprising:

a tunable oscillator circuit; and
   a tuning means for tuning said oscillator circuit including:
   a conductive inductor pattern formed on a ferrite substrate; and
   a current source for providing current through said spiral inductor.

6. The circuit of claim 5, wherein said inductor pattern comprises a spiral pattern.

7. A circuit for generating a modulated frequency output comprising:

an oscillator circuit; and
   means for modulating said oscillator circuit including:
   a conductive inductor pattern formed on a ferrite substrate;
   means for providing current through said inductor pattern proportional to the amplitude of a modulating signal.

8. The circuit of claim 6, wherein said inductor pattern comprises a spiral pattern.

9. A radio comprising:

transceiver means for communicating communication signals; and
   a circuit for generating a variable frequency output including:
   an oscillator circuit having a frequency output;
   a frequency variations means coupled to said oscillator circuit for varying said frequency output including:
   a conductive inductor pattern formed on a ferrite substrate; and
   a variable current source responsive to a frequency variation signal for providing current through said inductor.

10. The circuit of claim 9, wherein said inductor pattern comprises a spiral pattern.

11. The circuit of claim 9, wherein said frequency variation signal comprises a modulating signal.

12. The circuit of claim 9, wherein said frequency variation signal comprises a frequency tuning signal.

* * * * *